US011481121B2

(12) United States Patent
Peterson et al.

(10) Patent No.: US 11,481,121 B2
(45) Date of Patent: Oct. 25, 2022

(54) PHYSICAL MEDIA AWARE SPACIALLY COUPLED JOURNALING AND REPLAY

(71) Applicant: Amazon Technologies, Inc., Reno, NV (US)

(72) Inventors: Phillip Peterson, Seattle, WA (US); Leonid Baryudin, San Jose, CA (US); Daniel Sladic, San Jose, CA (US); Sujan Biswas, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 115 days.

(21) Appl. No.: 16/727,537

(22) Filed: Dec. 26, 2019

(65) Prior Publication Data

US 2020/0133519 A1    Apr. 30, 2020

Related U.S. Application Data

(63) Continuation of application No. 15/282,295, filed on Sep. 30, 2016, now Pat. No. 10,540,102.

(51) Int. Cl.
*G06F 11/00* (2006.01)
*G06F 3/06* (2006.01)
(Continued)

(52) U.S. Cl.
CPC .......... *G06F 3/0619* (2013.01); *G06F 3/0634* (2013.01); *G06F 3/0643* (2013.01);
(Continued)

(58) Field of Classification Search
CPC .. G06F 3/0619; G06F 3/0679; G06F 11/1471; G06F 11/1008; G06F 12/0246; G06F 12/10
See application file for complete search history.

(56) References Cited

U.S. PATENT DOCUMENTS 6,646,917 B1   11/2003   Yoshimura
8,793,429 B1   7/2014    Call
(Continued)

FOREIGN PATENT DOCUMENTS

CN   09791520     5/2019
JP   2004-133677  4/2004
(Continued)

OTHER PUBLICATIONS

Non-Final Office Action issued in corresponding U.S. Appl. No. 15/282,310 dated Jun. 29, 2018.
(Continued)

*Primary Examiner* — Philip Guyton
(74) *Attorney, Agent, or Firm* — Hogan Lovells US LLP

(57) ABSTRACT

An indirection mapping data structure can maintain a mapping between logical block addresses used by a host computer and physical data storage locations on a solid state drive. Changes to the indirection mapping data structure can be stored in journals. When a journal is full, the journal can be stored to a predetermined location on the cluster block determined based on the number of entries stored by the journal, leading to a number of journals scattered throughout the cluster block at predetermined locations. Each physical chunk of media, whether written with data or marked as defective is journaled. Such a journaling scheme, where the journal locations are predetermined and each physical chunk of media is journaled is referred to as physical media-aware spatially coupled journaling. During replay the spatially coupled journals can be retrieved from the predefined locations within cluster blocks and used to rebuild the indirection mapping data structure.

20 Claims, 9 Drawing Sheets

(51) Int. Cl.
*G06F 12/10* (2016.01)
*G06F 11/10* (2006.01)
*G06F 12/02* (2006.01)
*G06F 11/14* (2006.01)
*G11C 29/00* (2006.01)
*G11C 29/44* (2006.01)

(52) U.S. Cl.
CPC ........ *G06F 3/0679* (2013.01); *G06F 11/1008* (2013.01); *G06F 11/1471* (2013.01); *G06F 12/0246* (2013.01); *G06F 12/10* (2013.01); G06F 2212/7201 (2013.01); G06F 2212/7202 (2013.01); G06F 2212/7205 (2013.01); G06F 2212/7208 (2013.01); G11C 29/765 (2013.01); G11C 2029/4402 (2013.01)

(56) References Cited

U.S. PATENT DOCUMENTS

| | | | |
|---|---|---|---|
| 9,323,667 | B2 | 4/2016 | Bennett |
| 9,489,296 | B1 | 11/2016 | Tomlin |
| 9,817,576 | B2 | 11/2017 | Hayes |
| 10,489,289 | B1 | 11/2019 | Peterson |
| 10,540,102 | B2 * | 1/2020 | Peterson ............. G06F 11/1008 |
| 2003/0163594 | A1 | 8/2003 | Aasheim et al. |
| 2009/0150599 | A1 | 6/2009 | Bennet |
| 2009/0157989 | A1 | 6/2009 | Karamcheti |
| 2009/0282301 | A1 | 11/2009 | Flynn |
| 2010/0070735 | A1 | 3/2010 | Chen et al. |
| 2011/0060864 | A1 | 3/2011 | Yoshii et al. |
| 2011/0238898 | A1 | 9/2011 | Honda |
| 2012/0096217 | A1 | 4/2012 | Son |
| 2012/0297258 | A1 * | 11/2012 | Flynn .................. G06F 11/1068 714/710 |
| 2012/0303866 | A1 | 11/2012 | Sandie |
| 2014/0101369 | A1 | 4/2014 | Tomlin et al. |
| 2014/0136768 | A1 | 5/2014 | Iglesia |
| 2014/0195725 | A1 | 7/2014 | Bennett |
| 2014/0325117 | A1 * | 10/2014 | Canepa ............... G06F 12/0246 711/103 |
| 2015/0178164 | A1 * | 6/2015 | Zhang ................. G06F 11/1471 714/20 |
| 2017/0160987 | A1 | 6/2017 | Royer |
| 2017/0269992 | A1 | 9/2017 | Bandic |
| 2018/0074708 | A1 | 3/2018 | Gerhart |

FOREIGN PATENT DOCUMENTS

| | | |
|---|---|---|
| JP | 2013-16125 | 1/2013 |
| JP | 2015-530685 | 10/2015 |
| WO | 2014/055445 | 4/2014 |
| WO | 2018/064188 | 4/2018 |

OTHER PUBLICATIONS

Kang et al., "Object-based SCM: An Efficient Interface for Storage Class Memories", Storage Systems Research Center, University of California, Santa Cruz, pp. 1-12, 2011 IEEE.

Zhang et al., "De-indirection for Flash-based SSDs With Nameless Writes", Computer Sciences Department, University of Wisconsin-Madison, pp. 1-16.

Non-Final Office Action issued in corresponding U.S. Appl. No. 15/393,033 dated Apr. 30, 2018.

International Search Report and Written Opinion issued in related Application No. PCT/US2017/053763 dated Dec. 20, 2017.

Final Office Action issued in corresponding U.S. Appl. No. 15/393,033 dated Jan. 22, 2019.

Non-Final Office Action issued in corresponding U.S. Appl. No. 15/393,033 dated May 9, 2019.

Notice of Allowance issued in corresponding U.S. Appl. No. 15/393,033 dated Nov. 27, 2019.

Final Office Action issued in corresponding U.S. Appl. No. 15/282,310 dated Apr. 4, 2019.

Notice of Allowance issued in corresponding U.S. Appl. No. 15/282,310 dated Aug. 2, 2019.

International Preliminary Report on Patentability issued in related Application No. PCT/US2017/053763 dated Dec. 20, 2017.

Non-Final Office Action issued in corresponding U.S. Appl. No. 15/282,295 dated Jun. 11, 2018.

Final Office Action issued in corresponding U.S. Appl. No. 15/282,295 dated Dec. 12, 2018.

Non-Final Office Action issued in corresponding U.S. Appl. No. 15/282,295 dated Apr. 5, 2019.

Notice of Allowance issued in corresponding U.S. Appl. No. 15/282,295 dated Sep. 16, 2019.

First Office Action issued in JP Application No. 2019-517345 dated May 7, 2020.

Examination Report issued in EP Application No. 17 783 657.4, dated May 3, 2021.

\* cited by examiner

PHYSICAL MEDIA AWARE SPACIALLY COUPLED JOURNALING AND REPLAY

CROSS REFERENCE TO RELATED APPLICATION

This application is a continuation of, and accordingly claims the benefit of, U.S. patent application Ser. No. 15/282,295 filed with the U.S. Patent and Trademark Office on Sep. 30, 2016, which is hereby incorporated herein by reference.

BACKGROUND

Virtualized computing environments are frequently supported by block-based storage. Such block-based storage is increasingly provided by solid state drives (SSDs). SSDs provide a block-style interface, making it easy to integrate these drives into systems that have traditionally relied on hard drives and other block storage devices. SSD drive manufacturers incorporate a controller which provides the block-style interface and which manages data storage and mapping. For example when a read or write request is received, it may include a logical block address associated with the request. The controller may determine a physical location on the SSD from where the data should be read, or to where the data should be written. The controller may also manage data storage on the SSD to improve the longevity of the device and manage other flash-specific functions. However, while the drive manufacturer may provide a controller that is suitable for the average customer, such controllers may not provide sufficient flexibility or customizability for all users and applications for which such drives may be deployed.

BRIEF DESCRIPTION OF THE DRAWINGS

Various embodiments in accordance with the present disclosure will be described with reference to the drawings, in which.

DETAILED DESCRIPTION

Systems and methods in accordance with various embodiments of the present disclosure overcome one or more of the aforementioned and other deficiencies experienced in conventional approaches to managing solid state drives (SSDs) in a block-based storage service in an electronic environment. In particular, SSD management features may be decoupled from a built in SSD controller and implemented in an external controller. The SSD management features may include indirection mapping and replay. An indirection mapping data structure can maintain a mapping between logical block addresses used by a host computer and physical data storage locations on an SSD. Updates to the indirection mapping data structure can be stored in journals. One or more journals may be associated with a cluster block, such that the journals store updates to the indirection mapping data structure for that cluster block. In various embodiments, a cluster block may include a grouping of physical erase blocks across an array of N contiguous die. The grouping of physical erase blocks may include the same block index from each die to simplify translation from logical to physical erase blocks. In embodiments using multi-plane programming on a die, P consecutive blocks from each of the N die can be grouped into a single cluster block, where P is the number of planes supported by the NAND die. When a journal has reached a predefined limit, the journal can be stored to a predetermined location on the cluster block determined based on the number of entries stored by the journal. In some embodiments, each journal's predefined limit can be derived from a formula using one or more of the following as inputs: journal number, cluster block index number, cluster block sequence number. Such co-location at predetermined locations scattered throughout a cluster block is referred to as spatially coupled journaling. Further, each physical chunk of media in a cluster block, including defective/bad blocks that are not programmed, or other non-host data such as padding or other meta data, are captured in the journal. The journal is said to be physical media aware because of this direct mapping. When power is restored, following a power loss, the spatially coupled journals can be retrieved from the scattered predefined locations and used to rebuild the indirection mapping data structure.

Figure 1:
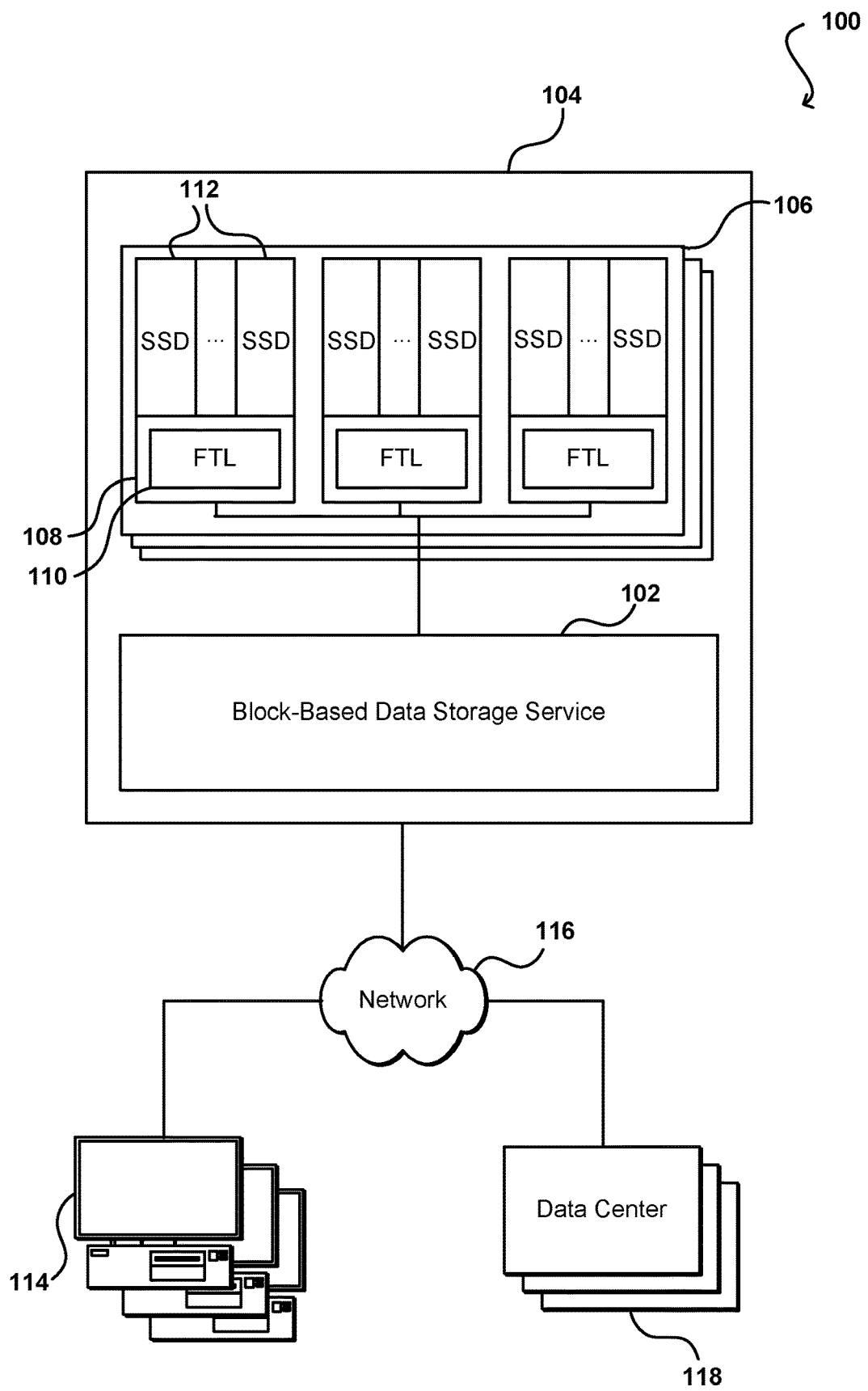
FIG. 1 illustrates an example environment in which aspects of various embodiments can be implemented.

FIG. 1 illustrates an example environment 100 in which aspects of various embodiments can be implemented. In this example configuration, a block-based data storage service 102 uses multiple block-based data storage systems in a data center 104 to provide reliable, non-local, block-based data storage to executing programs or various other components, systems, or services. Data center 102 includes a number of racks 104, each rack including a number of computing systems 106. The computing systems 106 on the illustrated rack 104 each can include a controller 108, including a flash translation layer (FTL) and one or more solid state drives (SSD) 110. Solid state drives typically include a controller that performs various management functions. However, in various embodiments, these functions are decoupled from the drive itself and provided by external controller 108. For example the flash translation layer of controller 108 may provide journaling, replay, and other indirection mapping management services, as discussed further below.

As shown in FIG. 1, a block-based data storage service 112 can provision block storage devices for one or more host computing systems 114, virtual machines, and/or other services. In some embodiments, block storage devices may be accessed over a network 116, including a local network and/or an external network (e.g., the Internet or another public data network). In some embodiments, the data center 104 can be connected via the network 116 to one or more other data centers 118 that each may include some or all of the computing systems and storage systems illustrated with respect to data center 104. The host computing systems 114 may be operated by various parties for various purposes, such as by the operator of the data center or third parties (e.g., customers of the block-based data storage service). In addition, one or more of the other computing systems may be archival storage systems (e.g., as part of a remote network-accessible storage service) with which the block data storage service may interact, such as under control of one or more archival manager modules (not shown) that execute on the one or more other computing systems or instead on one or more computing systems of the data center.

It will be appreciated that the example of FIG. 1 has been simplified for the purposes of explanation, and that the number and organization of host computing systems, server block data storage systems and other devices may be much larger than what is depicted in FIG. 1. For example, as one illustrative embodiment, there may be thousands of computing systems per data center, with at least some of those computing systems being host computing systems that may each host one or more virtual machines, and/or with some of those computing systems being block-based data storage systems that may each store several volume copies. If each hosted virtual machine executes one program, then such a data center may execute as many as tens of thousands of program copies at one time. Furthermore, hundreds or thousands (or more) of volumes may be stored on the server block data storage systems, depending on the number of server storage systems, size of the volumes, and number of mirror copies per volume. It will be appreciated that in other embodiments, other numbers of computing systems, programs and volumes may be used.

In various embodiments, the block-based storage service can expose the storage to the customers as a Web service. Customers can submit Web services requests, or other appropriate requests or calls, to allocate storage on those servers and/or access that storage from the instances provisioned for those customers. In certain embodiments, a user is able to access the data volumes of these storage devices as if those storage devices are conventional block devices. Since the data volumes will appear to the customer instances as if each volume is a disk drive or similar block device, the volumes can be addressed with offsets, lengths, and other such conventional block device aspects.

Traditional solid state drives (SSDs) include a controller that provides various drive and data management features. For example, SSDs store data persistently in flash cells; however data cannot be overwritten and instead must be first erased before new data can be stored. Additionally, each cell has a finite number of write/erase cycles before it can no longer reliably store data. As such, to effectively manage data storage, SSD-specific garbage collection, replay, and trim methods may be implemented by the SSD controller. As discussed above, these features are provided by drive manufacturers and may not be suitable for all users. Many of the features provided by the controller can be decoupled from the SSD in accordance with various embodiments.

Figure 2:
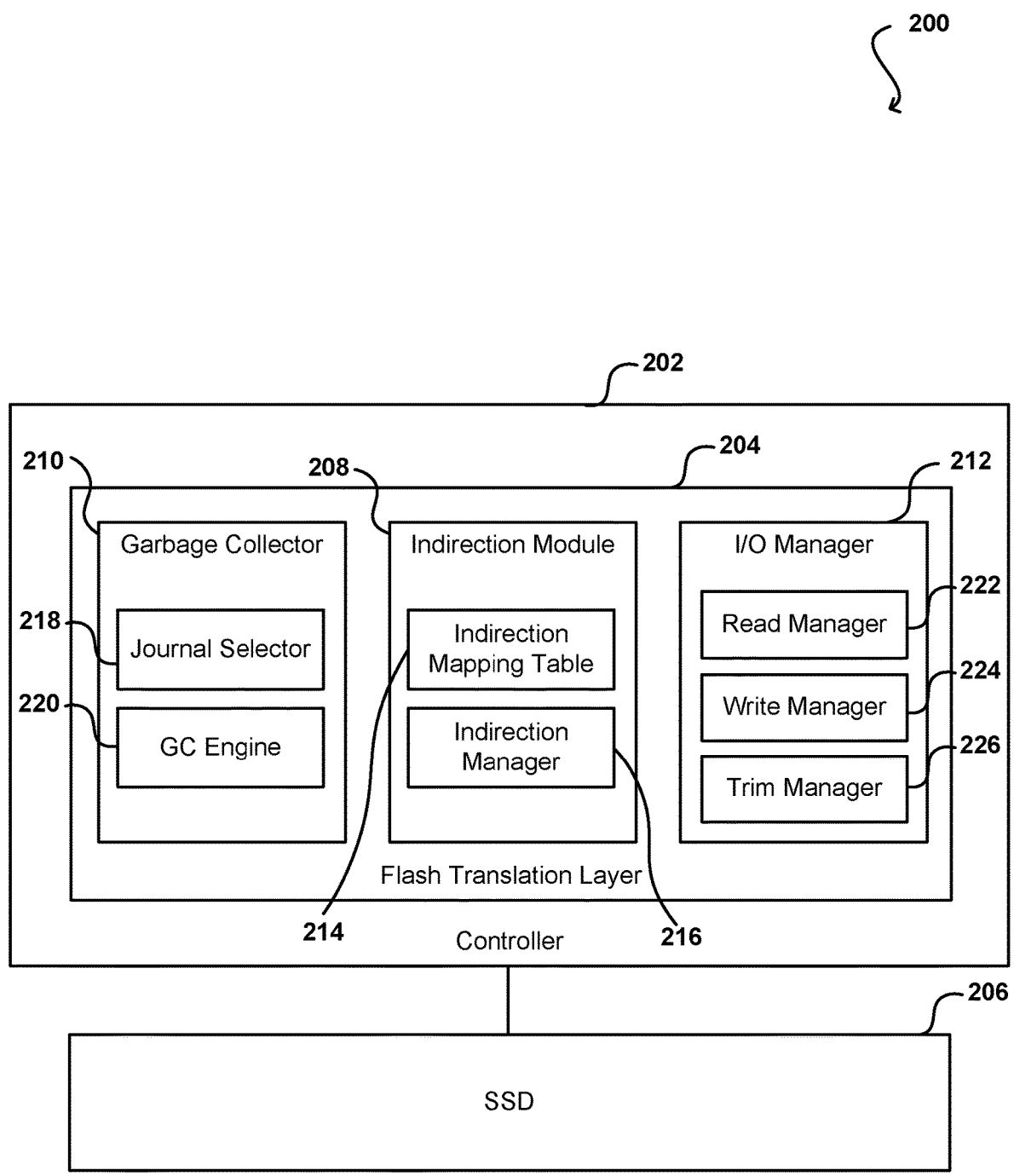
FIG. 2 illustrates block diagram of a flash translation layer for a solid state drive that can be utilized in accordance with various embodiments.

FIG. 2 illustrates block diagram 200 of a controller decoupled from a solid state drive that can be utilized in accordance with various embodiments. Controller 202 can include a flash translation layer (FTL) 204 which provides various data management features for a SSD 206. As shown in FIG. 2, FTL 204 can include indirection module 208, a garbage collector 210, and input/output manager 212. Many of these management features require locating where data is stored physically on the SSD. Indirection module 208 can manage these locations using an indirection mapping table 214 that maps logical block addresses which are used by a host computing system to the physical data locations on disk. These logical-to-physical mappings are described in indirection units stored in the indirection mapping table. An indirection manager 216 can enable indirection units in the indirection mapping table to be stored, modified, or updated. The indirection mapping table can be implemented as various data structures as would be known to one of ordinary skill in the art. In various embodiments, each indirection entry may represent multiple logically and contiguous data blocks.

Such indirection mapping tables can become quite large, increasing in size in proportion to the size of the SSD. The indirection mapping table may be maintained in volatile memory, such as RAM. This provides quick access to the mappings, but results in potential loss of the indirection mapping table in the event of a power failure or other unexpected power interruption. In various embodiments, and as discussed further below, a spatially coupled journaling scheme is implemented in which each time data is written to disk, a journal entry including logical address information. Based on the location of the journal entry, the corresponding physical location can be inferred. Each journal has a finite size, storing a maximum number of corresponding entries. In some embodiments all journals are of the same size. In some embodiments journals can be of variable size. Additionally, each physical chunk of media, whether defective or not, is journaled. By including a journal entry for every physical chunk of media, the journals can be stored at predetermined locations, regardless of the locations of defective blocks (e.g., bad blocks) on the disk. When the journal has reached a predefined limit, the journal is stored to the SSD within the same cluster block and immediately after the data it describes. As the journal includes a finite number of entries, corresponding to a known amount of disk space, the location of the journal on disk, relative to the start of a cluster block (or the last journal storage location) is known deterministically.

As discussed, a flash block must be in an erased state before data can be stored to it (e.g., data cannot be overwritten to the same physical location unless it is first erased). To accommodate these characteristics, data can be written sequentially to the next available page. When new data is written and associated with the same logical address as previously written data, the previously written data is invalidated. Garbage collector 210 can ensure erased cluster blocks are available to store data, and to reduce data fragmentation. Garbage collector 210 can include a journal selector 218 that can retrieve journals from the predetermined locations and determine whether the data is valid. Garbage collection engine 220 can then relocate data as needed or ignore the data, leading to it being erased when the cluster block is erased. Input/output manager 212 can manage read and write access to the SSD 206. In various embodiments, read manager 222 and write manager 224 may include read and write caches that store data requested to be read or written. In various embodiments, a trim manager 226 can enable a client device to indicate a range of logical addresses are stale and can be discarded. By enabling ranges of logical addresses to be marked stale by the client, garbage collection overhead can be reduced.

Figure 3:
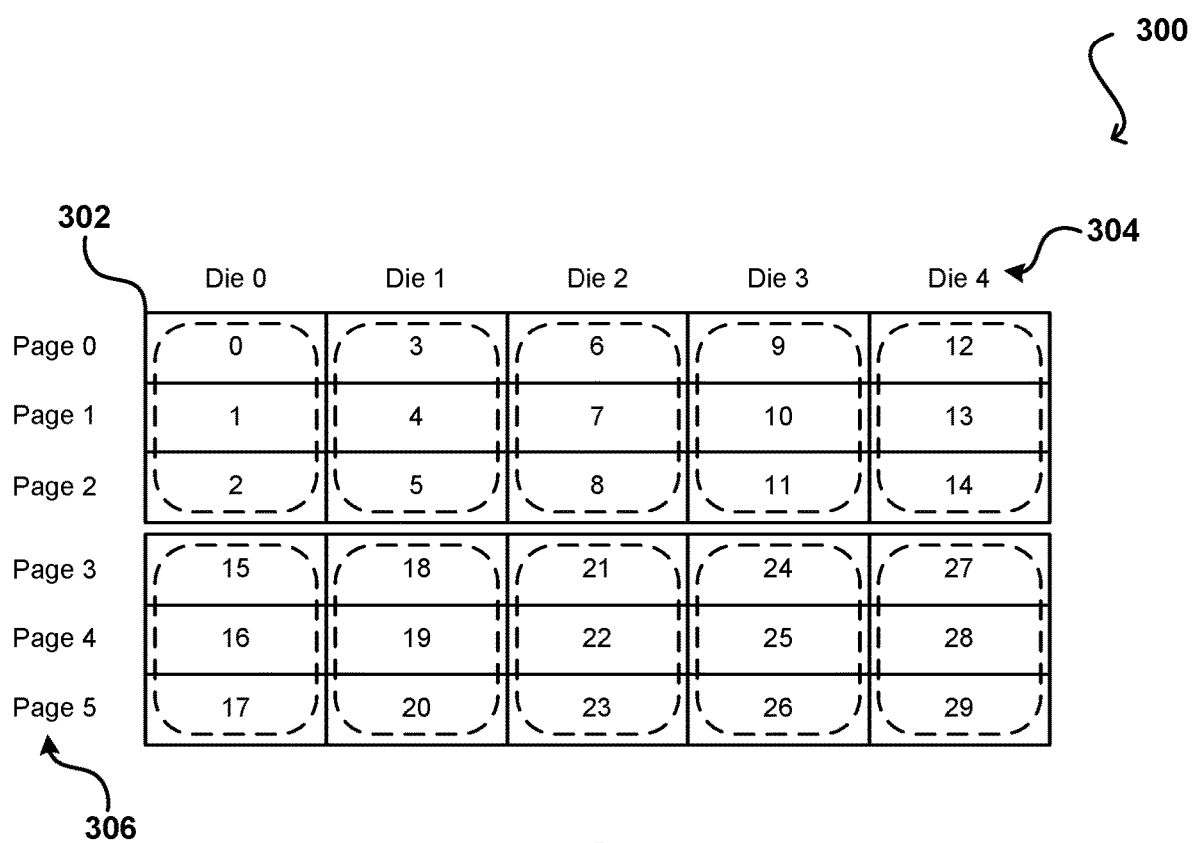
FIG. 3 illustrates a diagram of a flash array in accordance with various embodiments.

FIG. 3 illustrates a diagram 300 of a flash array in accordance with various embodiments. Cluster block 302 represents a grouping of contiguous die 304 on an SSD. This grouping may include physical erase blocks across an array of N contiguous die. The grouping of physical erase blocks may include the same block index from each die to simplify translation from logical to physical erase blocks. In embodiments using multi-plane programming on a die, P consecutive blocks from each of the N die can be grouped into a single cluster block, where P is the number of planes supported by the NAND die. When data is stored to disk, it is stored on one or more pages 306 of the cluster block 302. Although the example cluster block 302 shown in FIG. 3 includes five die 302 and six pages 304, alternative configurations may also be used. Additionally, cluster blocks may be variable in length. In this example, each dashed box represents the amount of physical space on the SSD that is written during a write operation. Each number inside each dashed box indicates an ordering in which indirection units are laid out on the cluster block. As data is written to the cluster block, corresponding entries are stored in a journal, with each entry corresponding to an indirection unit in the order shown. This example is continued in FIG. 4.

Figure 4:
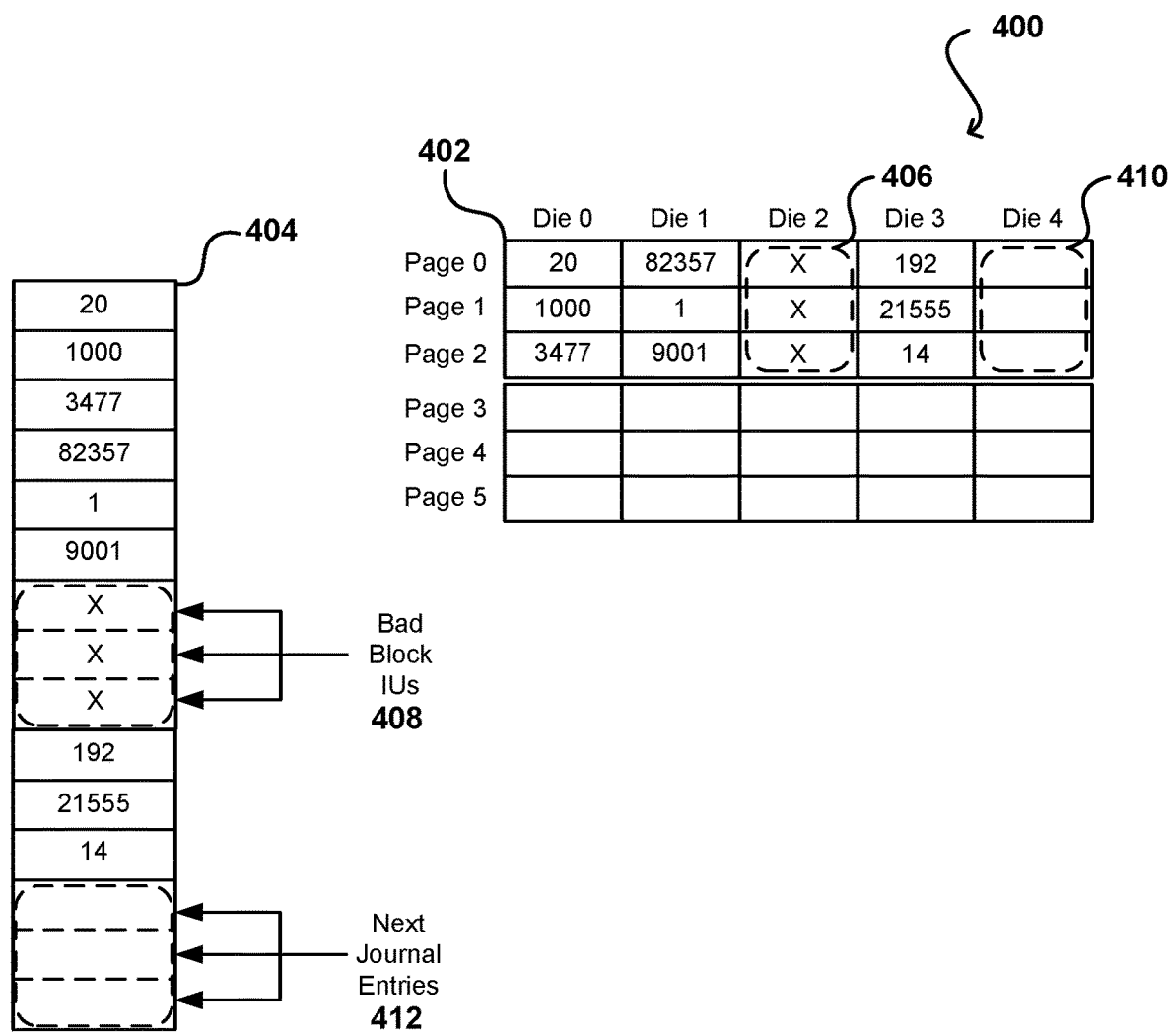
FIG. 4 illustrates a journal and flash array in accordance with various embodiments.

FIG. 4 illustrates a diagram 400 of a journal and flash array in accordance with various embodiments. As shown in FIG. 4, cluster block 402 stores data corresponding to logical block addresses. Journal 404 can be maintained in RAM and include the logical block addresses for data stored in the cluster block. The journal can be updated in the same order as data is written to disk. As shown above with respect to FIG. 3, data is written to disk in a particular order. For example, the first three entries of journal 404 correspond to die 0, pages 0-3, reflecting the order in which the data was written. By updating the journal in the same order, each entry in the journal corresponds to a known location on the disk. The journal includes entries for each physical portion of media, even if that portion is not written to, e.g., including defective or skipped blocks, such that the journal remains synchronized with the data on disk. For example, as shown in FIG. 4, dashed box 406 includes defective blocks indicated as having value X. These defective blocks, also referred to as bad blocks, may be identified using a bad block table, or through detection of an error during writing or during a subsequent read of the defective location. The journal 404 includes entries for every portion of physical disk, including the defective blocks, shown in journal entries 408. As discussed further below, this enables the spatially coupled journals to be used not only to rebuild the indirection map, but also to rebuild a bad block table on demand. As shown in FIG. 4, following defective blocks, the journal 404 may continue to include entries in order, as described above. For example, dashed box 410 indicates the next portion of disk to be written which corresponds to the next three entries 412 of journal 404.

In some embodiments, each journal 404 can be the same size. Once the journal has filled all of its entries, it can be stored to cluster block 402. For example, the size of the journal can be made equal to the size of an indirection unit such that the journal can be written in a single write operation and the next journal can include entries starting with the next indirection unit. Since each journal is stored at a predetermined location, each journal includes entries that map a fixed amount of physical media to logical units. Where these logical units are of fixed size, each journal has a fixed number of journal entries. If the logical units are of variable sizes, e.g., where compression is used, journals are still stored at predetermined locations. To enable the journals to be stored at the predetermined locations, each journal may include a variable number of entries. When entries corresponding to the fixed amount of physical disk space have been journaled, the journal can be closed and stored at the predetermined location. In this example, each journal may include a different number of journal entries, but will be stored at predetermined locations and cover a fixed amount of physical disk space.

Figure 5:
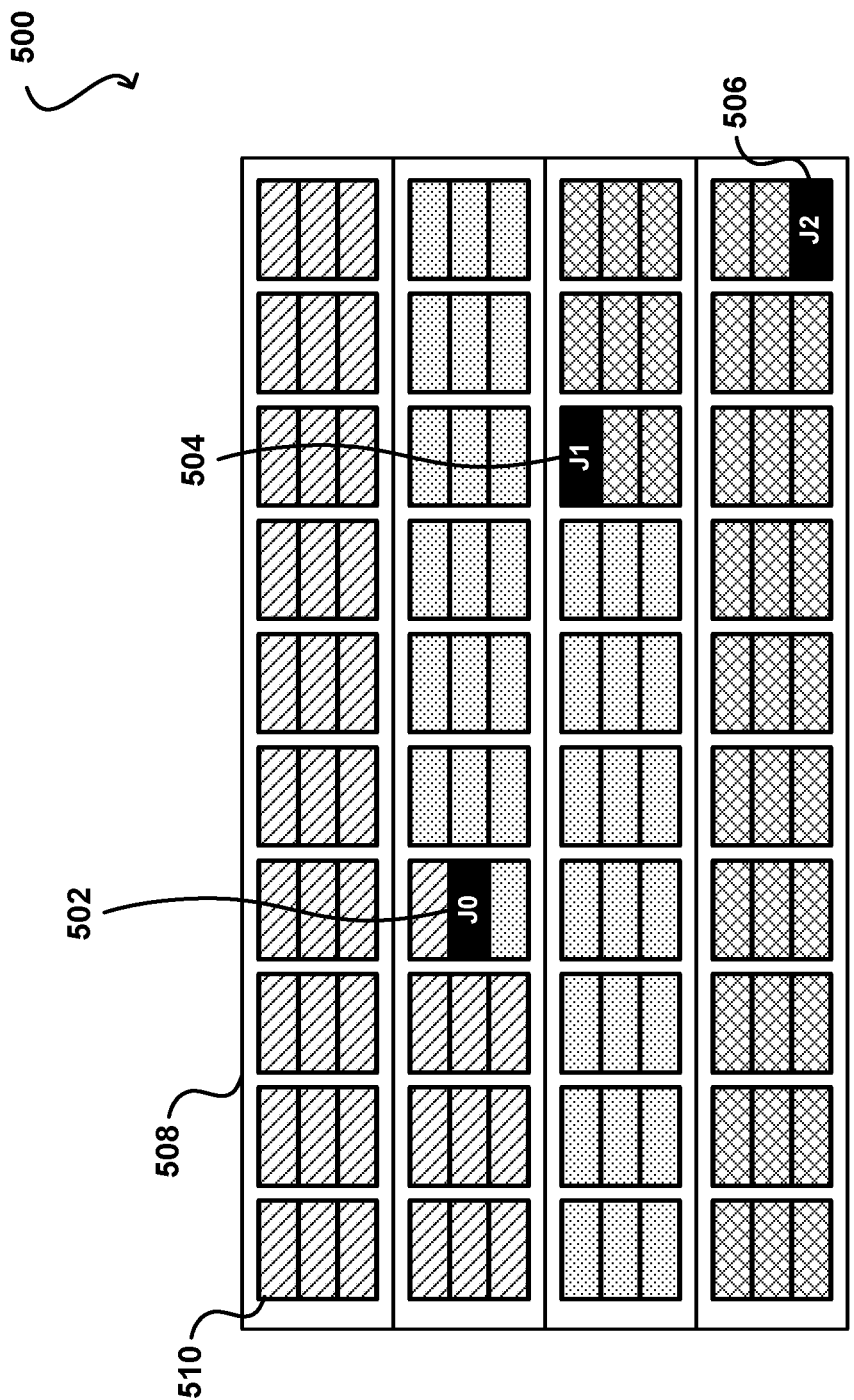
FIG. 5 illustrates spatially coupled journals in accordance with various embodiments.

FIG. 5 illustrates a diagram 500 of spatially coupled journals in accordance with various embodiments. As described above, a journal can be stored to disk in the same cluster block in-line with the data described in the journal. This is referred to as spatially coupled, as the journal and data are co-located. Additionally, because data is stored to disk in a particular order, each physical chunk of media is journaled including bad blocks, and the journals are of finite size, each journal is stored at a physical location on disk that is known deterministically from the start of a cluster block. In some embodiments, a journal can be stored upon detection of a journal storage event. As discussed, one example of a journal storage event is determining that the journal is full. When the journal is determined to be full, it can be saved to the next physical location on the cluster block. As shown in FIG. 5, multiple journals 502, 504, 506 can be spatially coupled to cluster block 508, each journal including indirection entries for data stored in the cluster block for indirection units before the journal but after any earlier stored journal. For example, journal 502 can include indirection entries for indirection units starting at the beginning 510 of cluster block 508 until the indirection unit immediately before journal 502. Similarly, journal 504 can include indirection entries for indirection units after journal 502 and immediately before journal 504.

As shown in this example, each journal is stored at a physical location that is known deterministically from the beginning of the cluster block, based on the size of the journal. For example, each journal in FIG. 5 stores 40 indirection entries, and is stored in the next indirection unit. To ensure the journals are stored at predetermined locations, a write placement manager can be configured to store the journal immediately upon detection of a journal storage event into the next indirection unit. Additionally, each journal is tied to a specific cluster block. As such, a journal that includes indirection units for a cluster block is stored in that cluster block. This may result in journals being closed before they are full. As such, another example of a journal storage event is determining that the cluster block is nearly full (e.g., has one, or other configurable number, remaining indirection unit). As shown in FIG. 5, journal 506 is closed at the end of the cluster block having one fewer entry than journals 502 or 504. Although the example of FIG. 5 shows journals having a small number of journal entries, this is for simplicity of depiction and explanation. In various embodiments, journals having more or fewer entries may be used. For example, if a journal is sized to match a 32 KiB indirection unit, each journal entry is 32 bits, and each journal includes a 20 byte header, the journal can include approximately 8,000 journal entries before being stored to disk. Such a journaling scheme enables a single 32 KiB journal to include indirection entries for approximately 256 MiB of data.

In some embodiments, the predetermined location where a journal is to be stored on the physical media may be defective (e.g., as of media production or due to use or other factor). In some embodiment, N contiguous locations on the physical media may be predetermined for each journal, where N can be defined to be any integer. For example, a predetermined location for a journal may correspond to 2 predetermined contiguous pages on an SSD. Although this increases the amount of space on the physical media dedicated to the journals, it provides layers of redundancy to ensure the fixed-location journaling scheme can still be used if one of the predetermined locations is defective. In some embodiments, defective locations can be remapped to non-defective locations logically. For example, a map of defective blocks mapped to journal locations can be maintained and remapped during device initialization to one or more non-defective locations. This remapping can be done by the SSD firmware or at the flash device level (if supported).

In some embodiments, where the number of dies in a cluster block is equal to or greater than the number of journals used in a cluster block, each journal can be stored to a different die. For example, as shown in FIG. 5, each journal 502, 504, 506 is stored to a different die. If a physical block in the cluster block exhibits a failure only a single journal is affected. To ensure journals are staggered across different dies, each journal can include a variable number of journal entries. Because the entire physical media is journaled, the number of journal entries can be predefined so that when full each journal is stored to a different die.

In some embodiments, if the number of dies in a cluster block is equal to or greater than double the number of journals used in a cluster block, then each journal can be duplicated and stored to a different die. If any die fails, no journals will be lost, as the corresponding copy can be recovered from its location on another die. Additionally, or alternatively, redundant array of independent disks (RAID) can be used to provide additional protection to the journals. For example, RAID 5 parity can be accumulated across all journals in the cluster block and saved for recovery in the event of a read failure on a journal.

Embodiments described above assume that each indirection entry corresponds to a fixed amount of disk space such that after a particular number of entries (e.g., the size of the journal) the journal is stored at a predetermined location. However, where compression algorithms are used, each entry may not correspond to the same amount of disk space. As such, if the journal is of fixed size and it is stored when it is filled, it may not be stored at a predetermined location. In some embodiments, a variable sized journal may be used that can be stored to disk upon detection that data has been written up to a predetermined location. For example, a write placement manager can keep track of write locations and cause the journal to be written to disk at a predetermined location. The journal can be closed and written to disk at the predetermined location regardless of the size of the journal, such that it can be later recovered from the predetermined location.

In some embodiments, because each journal is stored at a predetermined location, techniques may be used to reduce the likelihood of a defect at one of these locations. For example, some SSDs may be written in a single level cell (SLC) mode, where each cell stores a single bit of data, or a higher density storage mode such as multi-level cell (MLC) mode or triple level cell (TLC) mode where two bits or three bits, respectively may be stored per cell. SLC mode enables less data to be stored than MLC or TLC mode, but that data is stored more reliably. Accordingly, in some embodiments, user data may be stored to disk in MLC or TLC mode to maximize storage density. When a journal is stored in-line with the user data as discussed herein, it can be stored in SLC mode. This reduces the likelihood of a defect at the predetermined locations where the journals are stored, making the journals more robust. For example, journals 502, 504, 506, may be written in SLC mode, while all other indirection units shown in FIG. 5 may be written in TLC mode.

Figure 6:
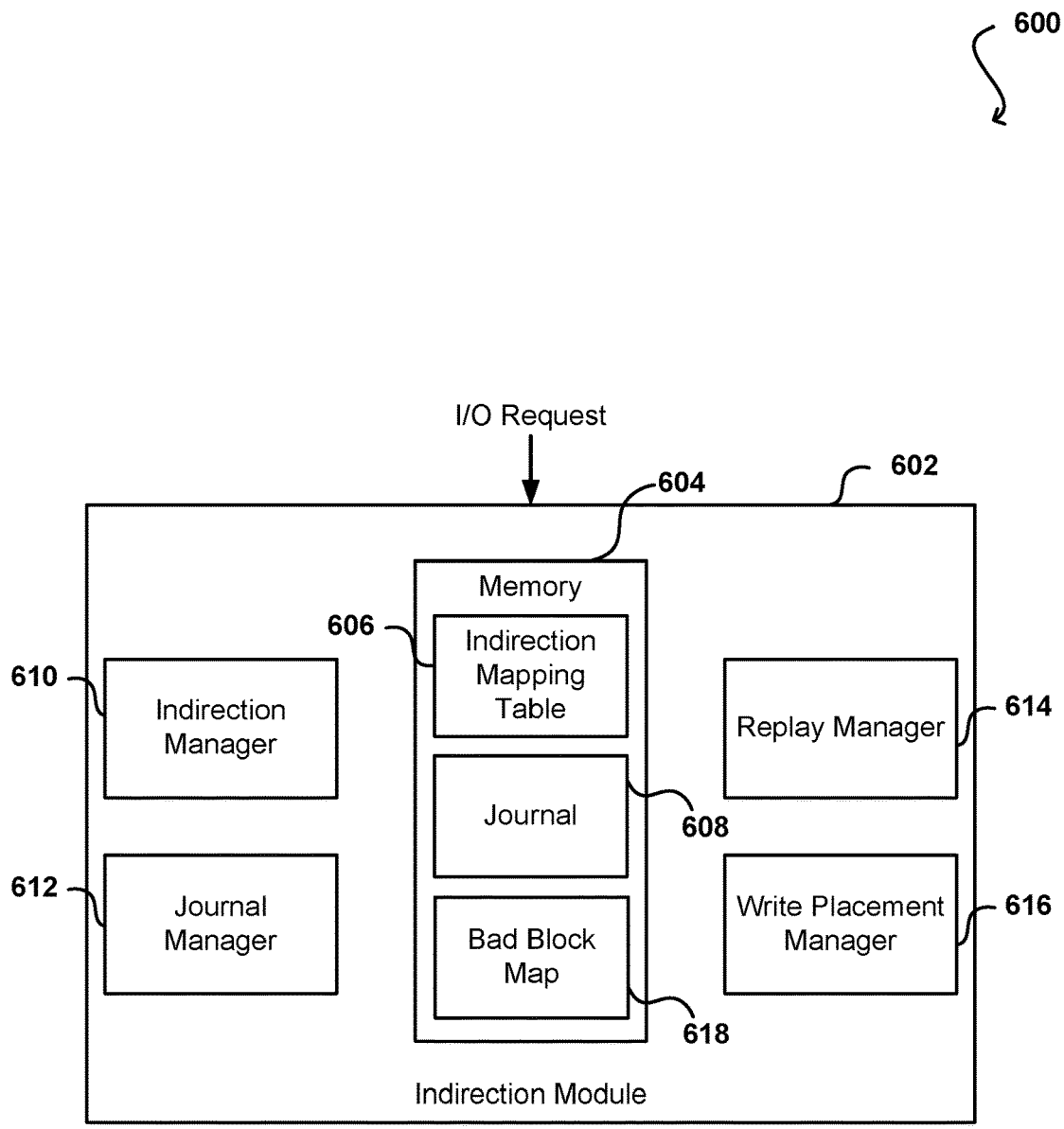
FIG. 6 illustrates a block diagram of an indirection module that can be utilized in accordance with various embodiments.

FIG. 6 illustrates a block diagram 600 of an indirection module that can be utilized in accordance with various embodiments. As discussed above, indirection management and replay functions can be decoupled from an SSD and provided by an external controller, such as controller 202 shown in FIG. 2. As shown in FIG. 6, an indirection module 602 can include memory 604, such as RAM, in which an indirection mapping table 606 is maintained. In some embodiments, memory 604 may also include one or more journals 608. In some embodiments, each journal may be maintained in a separate buffer before the journal is written to disk. At system boot, the memory 604 is cleared, as such if the indirection mapping table 606 has not been previously stored, it is also cleared. However, such indirection mapping tables can be quite large, including potentially hundreds of millions of entries. The size of the table makes it difficult to backup in the event of an unexpected power loss. Accordingly, embodiments use journals stored to disk to rebuild (also referred to herein as replay) the indirection mapping table at system boot. During replay, the journals may be read in the order they were written to rebuild the indirection mapping table with current values. This enables the indirection mapping table to be rebuilt by reading for instance 8 or 16 journals per cluster block rather than the entire cluster block itself.

In some embodiments, indirection manager 610 can enable client devices to read and update a given indirection entry. In various embodiments, indirection mapping table 606 can be implemented with different indirection granularity, depending on implementation needs. Indirection granularity may refer to the number of host data blocks (or sectors) that are referenced by one indirection unit in the indirection mapping table 606. For example, in some embodiments, an indirection granularity of 32 KiB may be used. If a drive is formatted as a 4 KiB block device, each indirection unit maps 8 sequential host sectors to 1 physical media location. In such embodiments, an indirection entry can be determined from a logical block address (LBA) of a sector by shifting off the lower three bits of the LBA. The indirection entry may indicate the die, block, and page corresponding to the LBA. To determine the sector within the indirection entry corresponding to the LBA, a mod operation can be performed. For example, in a 4 KiB block formatted drive, with a 16 KiB page size, and 32 KiB indirection unit, the first four sectors will be in the first block of the indirection unit and the second four sectors will be in the second block of the indirection unit.

In the event of an unexpected power loss, the size of the mapping table (e.g., approximately 4 GB for 32 TB) is large enough that maintaining sufficient power to store the map to non-volatile memory would be prohibitive. Instead, replay manager 614 can reconstruct indirection mapping table 606 using the spatially coupled journals. In various embodiments, replay manager 614 can initiate replay when a replay event is detected. Replay events may include a boot, upon recovery from power loss, upon receiving a replay request, etc. For example, during debugging, replay may be requested to be performed over an entire disk, or over a specific portion or portions of the media where errors were detected. In some embodiments, the first journal from each cluster block may be read from predetermined locations on each cluster block into memory 604. Using the cluster block sequence number from each journal, each cluster block may then be processed. For example, the journal from the first cluster block in the cluster block sequence can be read. As discussed, because the location of the journal is known, the size of the indirection units are known, and each physical chunk of media (including defective blocks) are journaled, the physical location of each indirection unit can be calculated without consulting any additional metadata. As such, when a logical block address is read in a journal entry, the corresponding physical location can be added to that LBA entry in the indirection mapping table. Each journal in the first cluster block may be retrieved from its predetermined location on disk and processed as discussed until the last journal on the cluster block has been processed and the indirection mapping table has been updated. Replay manager 614 can then move on to the next cluster block in the cluster block sequence. By processing each cluster block in order, physical locations of the stale data (e.g., mappings that are later changed) will be overwritten in the indirection mapping table such that once replay is complete, the indirection mapping table does not include stale mappings. By spatially coupling the journals at known locations on disk, replay can be performed without using checkpoints. Instead, journals can be read and processed in order to reconstruct the indirection mapping table.

In various embodiments, write placement manager 616 can receive write requests and push those writes to disk. In some embodiments, write placement manager 616 can include one or more write caches where write instructions are stored prior to being written to disk. When the write request is performed, journal manager 612 can update journal 608 accordingly. In some embodiments, multiple journal buffers can be allocated when a SSD is initialized. One journal can be marked active, with indirection entries added to the active journal. Once a journal storage event is detected, the journal can be written to disk and another journal, associated with another journal buffer, can be marked active. This enables write operations to be continuously pushed while the journal is being written without affecting response time.

In some embodiments, and as discussed further below, replay manager 614 may be configured to rebuild a defective block table, e.g., bad block map 618, during replay. As discussed, each portion of media is journaled, including defective blocks. This enables bad block map 618 to be reconstructed in case it is lost or corrupted. In some embodiments, bad block map 618, once recovered, can be stored from memory 604 to a non-volatile data store.

Figure 7:
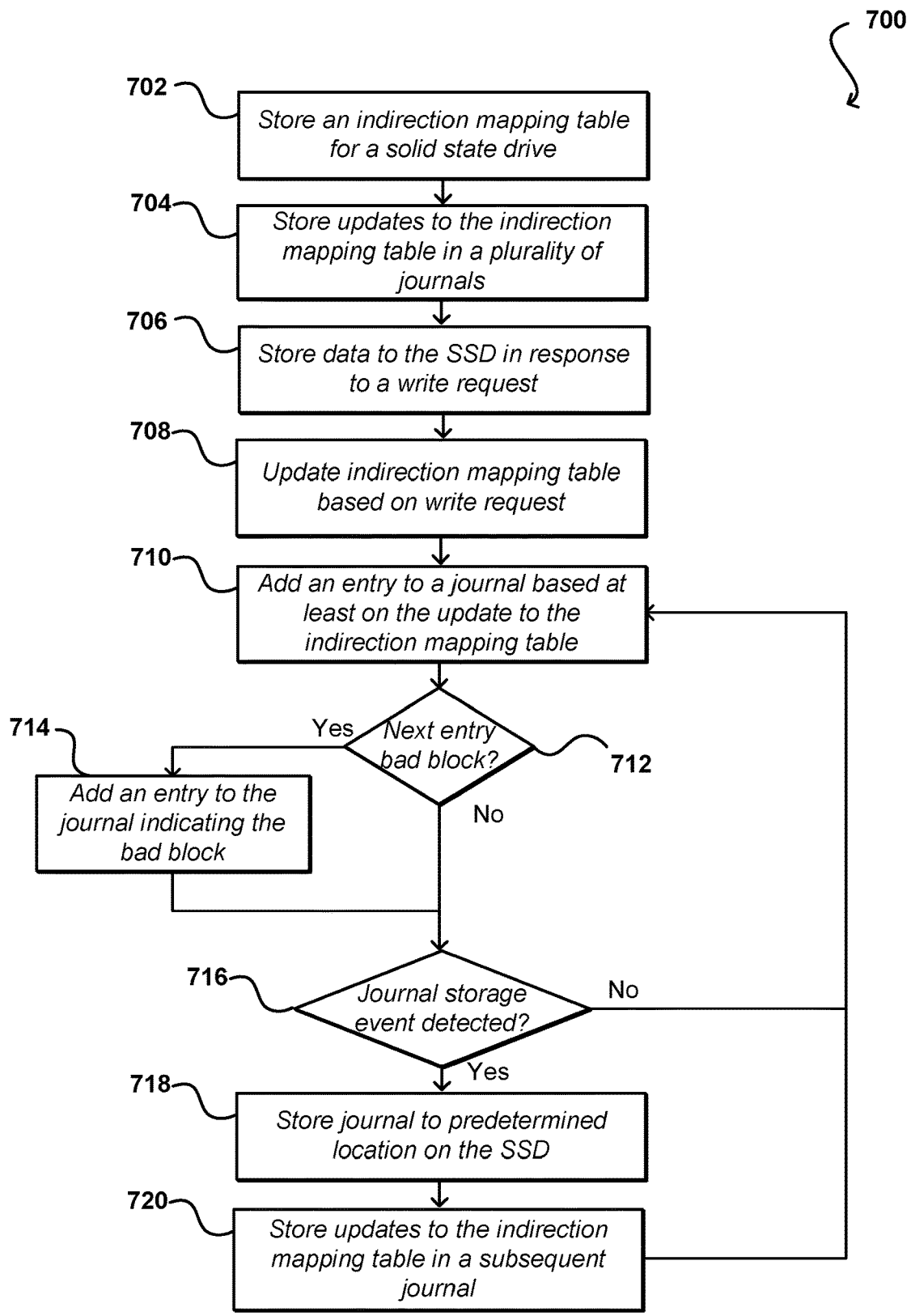
FIG. 7 illustrates a block diagram of a method of spatially coupled journaling that can be utilized in accordance with various embodiments.

FIG. 7 illustrates a block diagram 700 of a method of spatially coupled journaling that can be utilized in accordance with various embodiments. As shown in FIG. 7, indirection mapping table can be stored 702 for a solid state drive (SSD) in memory. The indirection mapping table can include a plurality of indirection units that map physical data locations on the SSD to logical addresses used by a host computer. In some embodiments, a write request can be received from a host computer to store data to the SSD. The data can be written to a physical data location in a cluster block on the SSD. As discussed, a write placement manager can determine a location on the cluster block to store the data. Data is written to blocks in the cluster block sequentially.

An indirection unit can be stored 704 to an indirection mapping table. The indirection unit maps the data to the physical data location in the cluster block on the SSD in the indirection mapping table. Data can be stored 706 to the SSD in response to a write request. Once the data has been stored, the indirection mapping table can be updated 708 to include a mapping to the physical data storage location where the data was stored. An entry can be added 710 to a journal using the indirection unit based on the write request. For example, an entry can be generated using a logical block address corresponding to the physical data location. In some embodiments, it can be determined 712 whether the next physical data location to be written to is defective. For example, an attempted read/write operation can be performed on the next physical data location. If an error is returned, the location can be determined to be defective. Additionally, or alternatively, the next physical data location can be looked up in a bad block map to determine whether it has already been identified as defective. If the next physical data location is determined to be defective, an entry can be appended 714 to the journal indicating the next physical data location is defective.

Journal entries can be appended to an active journal until a journal storage event is detected 716. If no journal storage event is detected, entries can continue being appended to the journal as write requests are received. Upon detecting the journal storage event, the journal can be stored 718 to a predetermined location. The predetermined location is co-located with the data in the cluster block. In some embodiments, the journal storage event may include determining that the journal includes a maximum number of journal entries. In some embodiments, the journal storage event can include determining that the journal includes a number of entries corresponding to a predetermined amount of disk space on the SSD. The journal can be stored in a journal buffer. In some embodiments, multiple journal buffers can be used, each storing a different journal.

In some embodiments, at the same time the active journal is written to disk, a new journal is opened in a different journal buffer. Subsequent updates to the indirection map can be stored 720 in the new journal. In some embodiments, a journal includes a header including a cluster block sequence number for the cluster block, and a content area including a plurality of entries mapping physical data locations of data on the cluster block to logical addresses.

Figure 8:
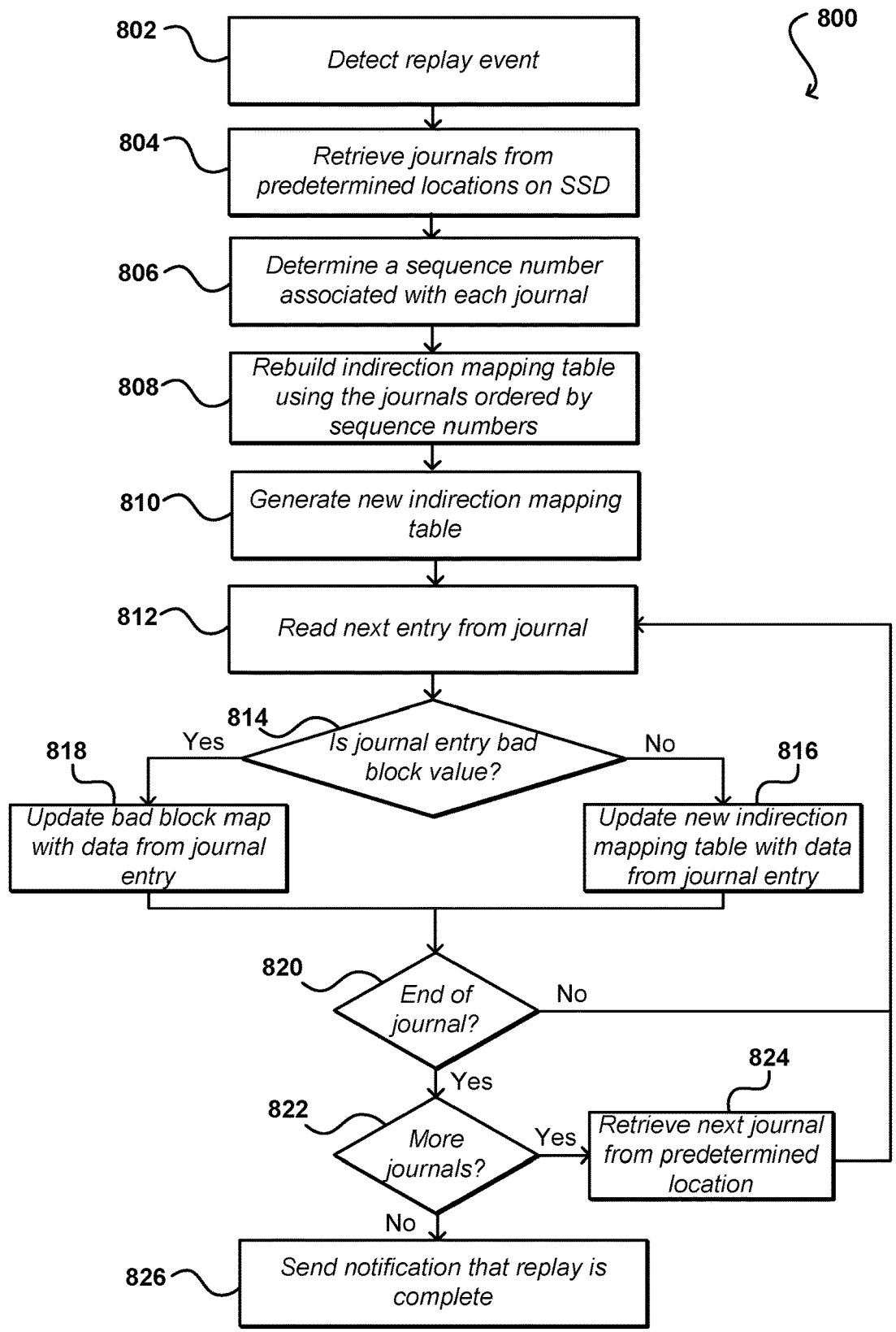
FIG. 8 illustrates a block diagram of a method of replay using spatially coupled journals that can be utilized in accordance with various embodiments.

FIG. 8 illustrates a block diagram 800 of a method of replay using physical media aware spatially coupled journals that can be utilized in accordance with various embodiments. A replay event can be detected 802. For example, a replay event may be a boot up event, a replay request, or other event. A journal from a predetermined location on the SSD can be retrieved 804. In some embodiments, a plurality of journals can be retrieved from a plurality of predetermined locations scattered throughout the cluster block. The plurality of journals may include a first journal from each cluster block, or every journal stored on the SSD, or any other combination of multiple journals.

A sequence number associated with a cluster block can be determined from the journal 806. For example, when a first journal is retrieved from each cluster block, the sequence numbers can be used to determine the order in which the cluster blocks are processed to rebuild the indirection mapping table. In some embodiments, the sequence number can be read from a header included in the journal. The indirection mapping table can be rebuilt 808 using the journals ordered by sequence numbers. Rebuilding the indirection mapping table can include creating 810 a new indirection mapping table. An entry can be read 812 from the current journal being parsed. As discussed, each portion of media is associated with a journal entry, including defective portions where no data is stored. The journal entry can be analyzed to determine 814 whether it includes a value indicating that the corresponding physical location is defective. If the journal entry does not indicate that it is defective, the new indirection mapping table can be updated 816 using the mapping data from the journal entry. If the journal entry does indicate that it is defective, then a bad block map can be updated 818 to include the corresponding physical location to the journal entry.

Once the journal entry has been processed, it can be determined 820 whether the end of the journal has been reached. If additional entries exist, processing may return to block 812 and the next entry can be processed. If the end of the journal has been reached, it can be determined 822 whether additional journals exist. In some embodiments, each journal may include journal header data. For example, the header may include a timestamp when the journal was written, when the first entry was written, when the last entry was written, or other data. Additionally, or alternatively, the journal header may include a total number of journals, updated each time a new journal is stored. In various embodiments, the data in the journal header may be used to determine an order in which to process the journals. If additional journals exist, the next journal can be retrieved 824 from its predetermined location and the entries of the next journal can be processed as discussed above with respect to blocks 812-820. If no additional journals exist, a notification can be sent 826 indicating replay is complete. Once complete, the indirection mapping table and bad block map have each been rebuilt. Although the embodiment of FIG. 8 describes the indirection mapping table and bad block map being rebuilt during the same replay operation, in various embodiments, replay may be performed to rebuild either the indirection mapping table or the bad block map alone. For example, a request may be received to rebuild the bad block map without also rebuilding the indirection mapping table. In such an example, at step 814, if the journal entry does not include a bad block value, processing may proceed directly to step 820. Similarly, if a request is received to rebuild the indirection mapping table but no the bad block map, at step 814 if the journal entry includes a bad block value, processing may proceed directly to step 820.

Figure 9:
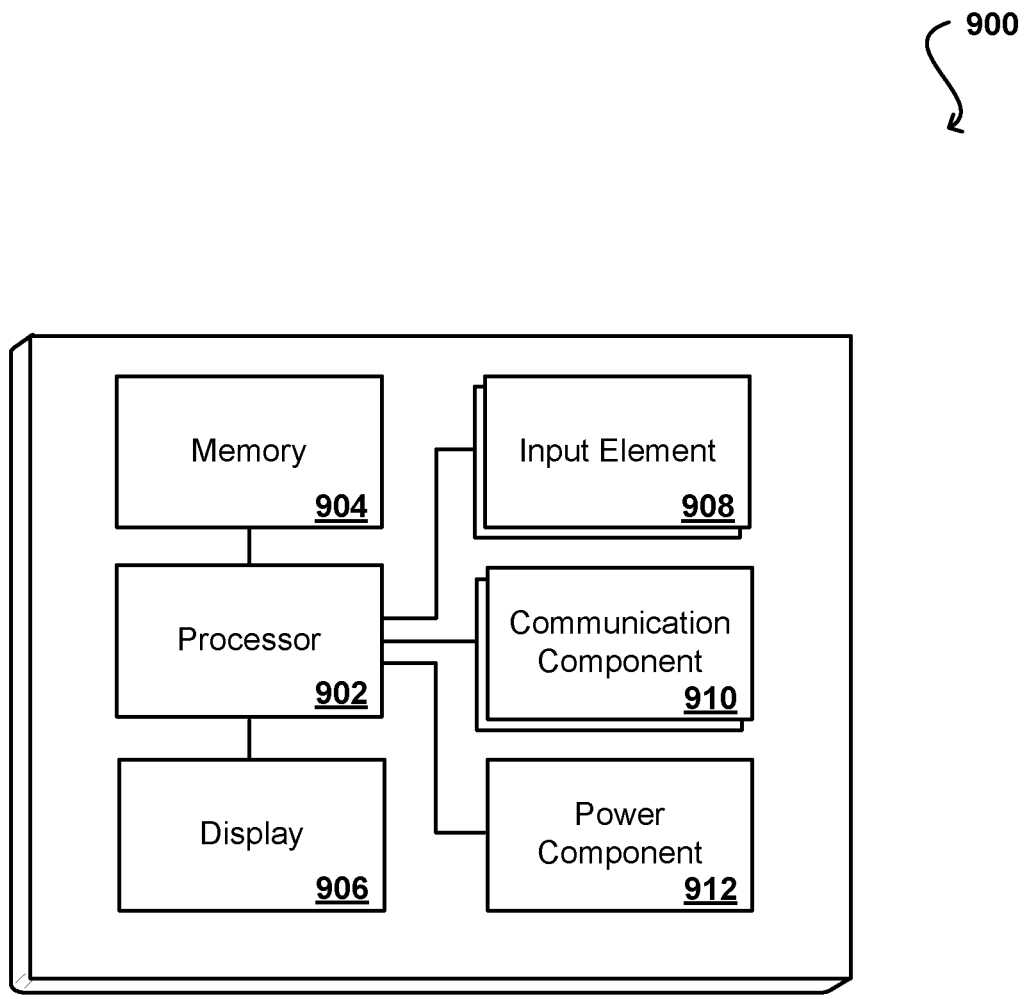
FIG. 9 illustrates components of an example computing device that can be used to perform aspects of the various embodiments.

FIG. 9 illustrates a logical arrangement of a set of general components of an example computing device that can be used to implement aspects of the various embodiments. In this example, the device includes a processor 902 for executing instructions that can be stored in a memory device or element 904. As would be apparent to one of ordinary skill in the art, the device can include many types of memory, data storage, or non-transitory computer-readable storage media, such as a first data storage for program instructions for execution by the processor 902, a separate storage for images or data, a removable memory for sharing information with other devices, etc. The device may include some type of display element 906, such as a touch screen or liquid crystal display (LCD), although devices such as portable media players might convey information via other means, such as through audio speakers. In some embodiments, the computing device 900 can include one or more networking and/or communication elements 908, such as a Wi-Fi, Bluetooth, RF, wired, or wireless communication system. The device in many embodiments can communicate with a network, such as the Internet, and may be able to communicate with other such devices. In some embodiments the device can include at least one additional input component 910 able to receive conventional input from a user. This conventional input can include, for example, a push button, touch pad, touch screen, wheel, joystick, keyboard, mouse, keypad, or any other such device or element whereby a user can input a command to the device. In some embodiments, however, such a device might not include any buttons at all, and might be controlled only through a combination of visual and audio commands, such that a user can control the device without having to be in contact with the device. The device will also include one or more power components 912, such as a power source, battery compartment, wireless charging circuitry, and the like, for providing and/or obtaining the power needed for the computing device.

As discussed, different approaches can be implemented in various environments in accordance with the described embodiments. As will be appreciated, although a Web-based environment may be used for many examples herein for purposes of explanation, different environments may be used, as appropriate, to implement various embodiments. Such a system can include one or more electronic client devices, which can include any appropriate device operable to send and receive requests, messages or information over an appropriate network and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled via wired or wireless connections and combinations thereof.

An illustrative environment can include at least one application server and data store. It should be understood that there can be several application servers, layers or other elements, processes or components, which may be chained or otherwise configured, which can interact to perform tasks such as obtaining data from an appropriate data store. As used herein the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device and handling a majority of the data access and business logic for an application. The application server provides access control services in cooperation with the data store and is able to generate content such as text, graphics, audio and/or video to be transferred to the user, which may be served to the user by the Web server in the form of HTML, XML or another appropriate structured language in this example. The handling of all requests and responses, as well as the delivery of content between the client device and the application server, can be handled by the Web server. It should be understood that the Web and application servers are not required and are merely example components, as structured code discussed herein can be executed on any appropriate device or host machine as discussed elsewhere herein.

Each server typically will include an operating system that provides executable program instructions for the general administration and operation of that server and typically will include computer-readable medium storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated. Thus, the depiction of any system herein should be taken as being illustrative in nature and not limiting to the scope of the disclosure.

As discussed above, the various embodiments can be implemented in a wide variety of operating environments, which in some cases can include one or more user computers, computing devices, or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Various aspects also can be implemented as part of at least one service or Web service, such as may be part of a service-oriented architecture. Services such as Web services can communicate using any appropriate type of messaging, such as by using messages in extensible markup language (XML) format and exchanged using an appropriate protocol such as SOAP (derived from the "Simple Object Access Protocol"). Processes provided or executed by such services can be written in any appropriate language, such as the Web Services Description Language (WSDL). Using a language such as WSDL allows for functionality such as the automated generation of client-side code in various SOAP frameworks.

Most embodiments utilize at least one network that would be familiar to those skilled in the art for supporting communications using any of a variety of commercially-available protocols, such as TCP/IP, FTP, UPnP, NFS, and CIFS. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including HTTP servers, FTP servers, CGI servers, data servers, Java servers, and business application servers. The server(s) also may be capable of executing programs or scripts in response requests from user devices, such as by executing one or more Web applications that may be implemented as one or more scripts or programs written in any programming language, such as Java®, C, C# or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable non-transitory media implemented in any method or technology for storage of information such as computer readable instructions, data structures, program modules, or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:
1. A computer-implemented method, comprising:
   receiving, from a client device, a request to store data to a solid state drive (SSD);

updating a mapping table, the mapping table mapping physical data locations on the SSD to logical addresses;
generating an entry to a journal based at least in part on the request; and
storing the journal to a predetermined location, the predetermined location on a cluster block determined by an indirection manager, in communication with at least one journal buffer, and based at least in part on the number of entries stored by the journal, the indirection manager permitting the client device to update the entry to the journal.

2. The computer-implemented method of claim 1, wherein the journal is co-located with data described by the journal.

3. The computer-implemented method of claim 1, wherein each entry to the journal corresponds to a fixed amount of SSD space.

4. The computer-implemented method of claim 1, wherein each entry to the journal corresponds to a variable amount of disk space, and further comprising detecting a journal storage event, the detecting a journal storage event including:
determining the journal includes a number of entries corresponding to a predetermined amount of disk space on the SSD.

5. The computer-implemented method of claim 1, wherein each journal includes a header including a cluster block sequence number and a content area.

6. The computer-implemented method of claim 1, further comprising:
receiving a subsequent request;
determining a physical location on the SSD, corresponding to the subsequent request, is defective; and
generating a subsequent entry to the journal including a bad block value.

7. The computer-implemented method of claim 1, further comprising:
detecting a replay event;
retrieving a plurality of journals from a plurality of predetermined locations;
rebuilding the mapping table based on the plurality of journals; and
generating a bad block map based at least on the plurality of journals.

8. The computer-implemented method of claim 7, wherein generating a bad block map based on the plurality of journals further comprises:
storing a bad block map in memory, the bad block map including at least one physical location on the SSD that is defective;
determining a journal entry includes a bad block value; and
updating the bad block map based on the journal entry, including a physical location on the SSD corresponding to the journal entry.

9. The computer-implemented method of claim 1, further comprising:
writing the data to the SSD in a multi-level cell or a triple level cell mode.

10. A system, comprising:
at least one processor; and
memory including instructions that, when executed by the at least one processor, cause the system to:
receive, from a client device, a request to store data to a solid state drive (SSD);
update a mapping table, the mapping table mapping physical data locations on the SSD to logical addresses;
generate an entry to a journal based at least in part on the request; and
store the journal to a predetermined location, the predetermined location on a cluster block determined by an indirection manager, in communication with at least one journal buffer, and based at least in part on the number of entries stored by the journal, the indirection manager permitting the client device to update the entry to the journal.

11. The system of claim 10, wherein the journal is co-located with data described by the journal.

12. The system of claim 10, wherein each entry to the journal corresponds to a fixed amount of SSD space.

13. The system of claim 10, wherein the instructions, when executed by the at least one processor, further cause the system to:
detect a journal storage event, the detecting a journal storage event including:
determine the journal includes a number of entries corresponding to a predetermined amount of disk space on the SSD.

14. The system of claim 10, wherein each journal includes a header including a cluster block sequence number and a content area.

15. The system of claim 10, wherein the instructions, when executed by the at least one processor, further cause the system to:
receive a subsequent request;
determine a physical location on the SSD, corresponding to the subsequent request, is defective; and
generate a subsequent entry to the journal including a bad block value.

16. The system of claim 10, wherein the instructions, when executed by the at least one processor, further cause the system to:
detect a replay event;
retrieve a plurality of journals from a plurality of predetermined locations;
rebuild the mapping table based on the plurality of journals; and
generate a bad block map based at least on the plurality of journals.

17. A non-transitory computer-readable storage medium storing instructions that, when executed by at least one processor of a computing device, cause the computing device to:
receive, from a client device, a request to store data to a solid state drive (SSD);
update a mapping table, the mapping table mapping physical data locations on the SSD to logical addresses;
generate an entry to a journal based at least in part on the request; and
store the journal to a predetermined location, the predetermined location on a cluster block determined by an indirection manager, in communication with at least one journal buffer, and based at least in part on the number of entries stored by the journal, the indirection manager permitting the client device to update the entry to the journal.

18. The non-transitory computer-readable storage medium of claim 17, wherein the instructions, when executed, further cause the computing device to:
detect a replay event;
retrieve plurality of journals from a plurality of predetermined locations;
rebuild the mapping table based on the plurality of journals; and generate a bad block map based at least on the plurality of journals.

19. The non-transitory computer-readable storage medium of claim 18, wherein the instructions, when executed, further cause the computing device to:
store a bad block map in memory, the bad block map including at least one physical location on the SSD that is defective;
determine a journal entry includes a bad block value; and
update the bad block map based on the journal entry, including a physical location on the SSD corresponding to the journal entry.

20. The non-transitory computer-readable storage medium of claim 17, wherein the instructions, when executed, cause the computing device to:
write the data to the SSD in a multi-level cell or a triple level cell mode.

* * * * *